United States

Hill

4,041,395

Aug. 9, 1977

[54] TRANSMITTER PERFORMANCE MONITOR AND ANTENNA MATCHING SYSTEM

[75] Inventor: John Carroll Hill, Rochester, Mich.

[73] Assignee: Integral Engineering & Manufacturing Corporation, Detroit, Mich.

[21] Appl. No.: 710,611

[22] Filed: Aug. 2, 1976

[51] Int. Cl.$^2$ .......................................... H04B 17/00
[52] U.S. Cl. .................................. 325/133; 324/58 B; 324/140 D; 325/67; 328/161
[58] Field of Search ...................... 325/2, 67, 133, 134, 325/159, 160, 172, 174, 177, 178, 187; 333/17 R, 17 M; 328/161; 324/57 R, 57 N, 58 A, 58 B, 77 F, 140 R, 140 D

[56] References Cited

U.S. PATENT DOCUMENTS

| 2,880,395 | 3/1959 | MacDowell | 332/20 |
|---|---|---|---|
| 3,020,529 | 2/1962 | Turner | 340/253 |
| 3,197,696 | 7/1965 | Bibo | 324/58 |
| 3,255,417 | 6/1966 | Gottlieb | 324/140 D |
| 3,320,536 | 5/1967 | Lockwood | 325/187 |
| 3,366,883 | 1/1968 | Griffin et al. | 325/144 |
| 3,601,717 | 8/1971 | Kuecken | 333/17 M |
| 3,678,381 | 7/1972 | Beaudry | 324/58 B |
| 3,737,781 | 6/1973 | Deerkoski | 325/67 |
| 3,755,732 | 8/1973 | Couper | 324/58 |
| 3,784,911 | 1/1974 | Ramstrom | 324/95 |
| 3,825,825 | 7/1974 | Smolka | 325/174 |
| 3,870,957 | 3/1975 | Straw | 325/187 |
| 3,919,643 | 11/1975 | Templin | 325/150 |

*Primary Examiner*—Robert L. Griffin
*Assistant Examiner*—Marc E. Bookbinder
*Attorney, Agent, or Firm*—Blanchard, Flynn, Thiel, Boutell & Tanis

[57] ABSTRACT

A system for detecting, indicating, and adjusting the degree of mismatch between a transmitter and an electrical transmission line, with additional measurement of transmitter performance parameters. This system uses a three-wire transmission line sensor to generate signals proportional to the forward and reflected waves on the main transmission line. These signals are applied to a special-purpose computer which automatically calculates the standing wave ratio (SWR) on the transmission line. An adjustable matching network is included to allow adjustment of the standing wave ratio to whatever value is required for proper transmitter operation. Additional sensors generate signals which are applied to the same computer, which automatically calculates the modulation percentage of the transmitter.

9 Claims, 1 Drawing Figure

TRANSMITTER PERFORMANCE MONITOR AND ANTENNA MATCHING SYSTEM

FIELD OF THE INVENTION

This invention relates in general to a system for monitoring radio transmitter performance and adjusting the impedance match between the transmitter and its load, and more particularly concerns a solid state electronic system for automatically measuring and indicating impedance mismatch and transmitter performance without the necessity of tedious and repetitive manual adjustments pursuant to such measurements and indications.

DISCUSSION OF THE PRIOR ART

Measurement of impedance mismatch is commonly accomplished by any one or a combination of several means. Such measurement means may include alternating current bridge circuits called reflectometers, directional couplers, slotted lines, and direct measurement of the voltage and current on the transmission line. The output signals from such measurements are commonly displayed on a single meter, and require a separate calibration adjustment prior to taking each reading. This calibration adjustment constitutes a significant drawback to the rapid adjustment of either the matching circuitry used to effect the impedance transformation, or to the rapid adjustment of the antenna or other radio frequency load. Since such adjustments must be carried out frequently, particularly on systems which operate over a relatively wide range of frequencies, the calibration step becomes a considerable nuisance at best; and since careful calibration adjustment is then often neglected, the meter readings obtained can become quite misleading as to the true state of affairs on the antenna system or other load. As a consequence, the matching network, antenna, or other load can be improperly adjusted resulting in excessive losses or improper transmitter operation.

Furthermore, as adjustments are made to the matching network, antenna, or other load, it is common for the output power of the transmitter to vary, which also affects the accuracy of the meter indications, requiring frequent recalibration—ideally as a part of each measurement.

Much the same state of affairs pertains to the measurement of transmitter performance parameters such as power output and modulation percentage, in that a separate calibration step such as adjusting for a full-scale meter deflection with an unmodulated carrier is required as a part of each mesurement, and must be repeated whenever the frequency is changed, load and/or impedance matching adjustments are made, or transmitter power level is changed.

Generally speaking, the need for a calibration adjustment connected with each measurement taken is a consequence of the fact that the quantities it is desired to measure, for example, standing wave ratio and/or modulation percentage, are related to the quantities actually measured by relationships of the following sort:

$$SWR = (F + R)/(F - R) \quad (1)$$

$$\% \; MOD = (Y - Z)/(Y + Z) \times 100 \quad (2)$$

where $SWR$ is the standing wave ratio, $F$ is the forward voltage or current, and $R$ is the reverse voltage or current; $\% \; MOD$ is the transmitter modulation percentage, $Y$ is the maximum amplitude of the modulated radio frequency wave, and $Z$ is the minimum amplitude of the modulated radio frequency wave. $F$, $R$, $Y$, and $Z$ are measurable, and the calculation required by equations (1) and (2) must be implemented in some fashion to derive a signal related to $SWR$ or $\% \; MOD$, whichever is desired.

In the prior art, this is accomplished by adjusting a calibration resistor to provide full-scale deflection of a meter when the meter is measuring, for example, F only. With F at a known level, the meter is switched to provide a deflection proportional to R, and the transformation to SWR required by equation (1) is carried out by a nonlinear scale on the meter. A similar procedure is used to measure modulation percentage as required by equation (2).

Thus, the need for a calibration adjustment arises from a desire to avoid implementation of some or all of the calculations implied by equations (1) and (2), specifically, the division by (F−R) and/or (Y+Z).

SUMMARY OF THE INVENTION

Broadly speaking, the present invention comprises a measurement and adjustment system for carrying out performance measurements and operating adjustments common to the operation of radio transmitters and/or amplifiers, including a special purpose computer for carrying out the calculations discussed under PRIOR ART. Since those calculations are carried out exactly, there is no requirement for frequent calibration of the various functions of the system, and the device is extremely flexible, rapid, and easy to use. Meter indications are invariant with respect to operating frequency, supply voltage, and transmitter power output level.

The system contains an electrically short section of three wire transmission line feeding an adjustable LC impedance matching network. Two of the wires are resistively terminated at opposite ends in such a way that one wire has a voltage proportional to the forward wave F and the other wire has a voltage proportional to the reverse wave R generated at its unterminated end. The two signals F and R serve as input signals to the special purpose computer (to be described later) during the measurement of the standing wave ratio. In addition, two diode-capacitor-resistor networks serve to measure the peak amplitude P of the radio wave and the average amplitude A of the radio wave. The two signals P and A serve as input signals to the special purpose computer during the measurement of the transmitter modulation percentage.

Operation of the special purpose computer will be described with respect to the SWR calculation (equation (1)). The basic computer consists of two operational amplifier circuits. Each has several inputs and a nonlinear feedback circuit, connected so that one operational amplifier produces an output proportional to the logarithm of the sum F + R, and the other produces an output proportional to the logarithm of the difference F − R. A meter measures the difference between the two amplifier outputs; hence meter deflection is proportional to the logarithm of the standing wave ratio, which provides a desirable scale expansion for small standing wave ratios. In addition, a third operational amplifier calculates the difference between the two amplifier outputs, and a fourth is connected as an antilog circuit, providing an output voltage and meter deflection directly proportional to standing wave ratio if desired. Since both F and R are measured and equation (1) is implemented exactly, the SWR indication is independent of transmitter power level, transmitter output frequency, and power supply voltage; the SWR indication changes immediately when matching network or load adjustments are made; and the SWR indication is invariant under modulation conditions even for single sideband modulation of the transmitter.

Operation of the modulation percentage meter is similar to the above, except that a novel detector is used. Two peak holding detectors are used. One has a very long time constant to provide an output voltage P proportional to the absolute peak of the transmitter output under modulation conditions, and the other has a very short time constant to provide an output voltage A whose DC component is proportional to the average transmitter output, i.e., the unmodulated carrier. The DC component is obtained by passing the short time constant detector output through a low pass RC filter. The modulation percentage is given by $$\% MOD = (P - A)/A \times 100$$

and is calculated by the first two operational amplifier stages (as in the SWR calculation) feeding the differencer and the antilog computer.

DESCRIPTION OF THE PREFERRED EMBODIMENT

Figure 1:
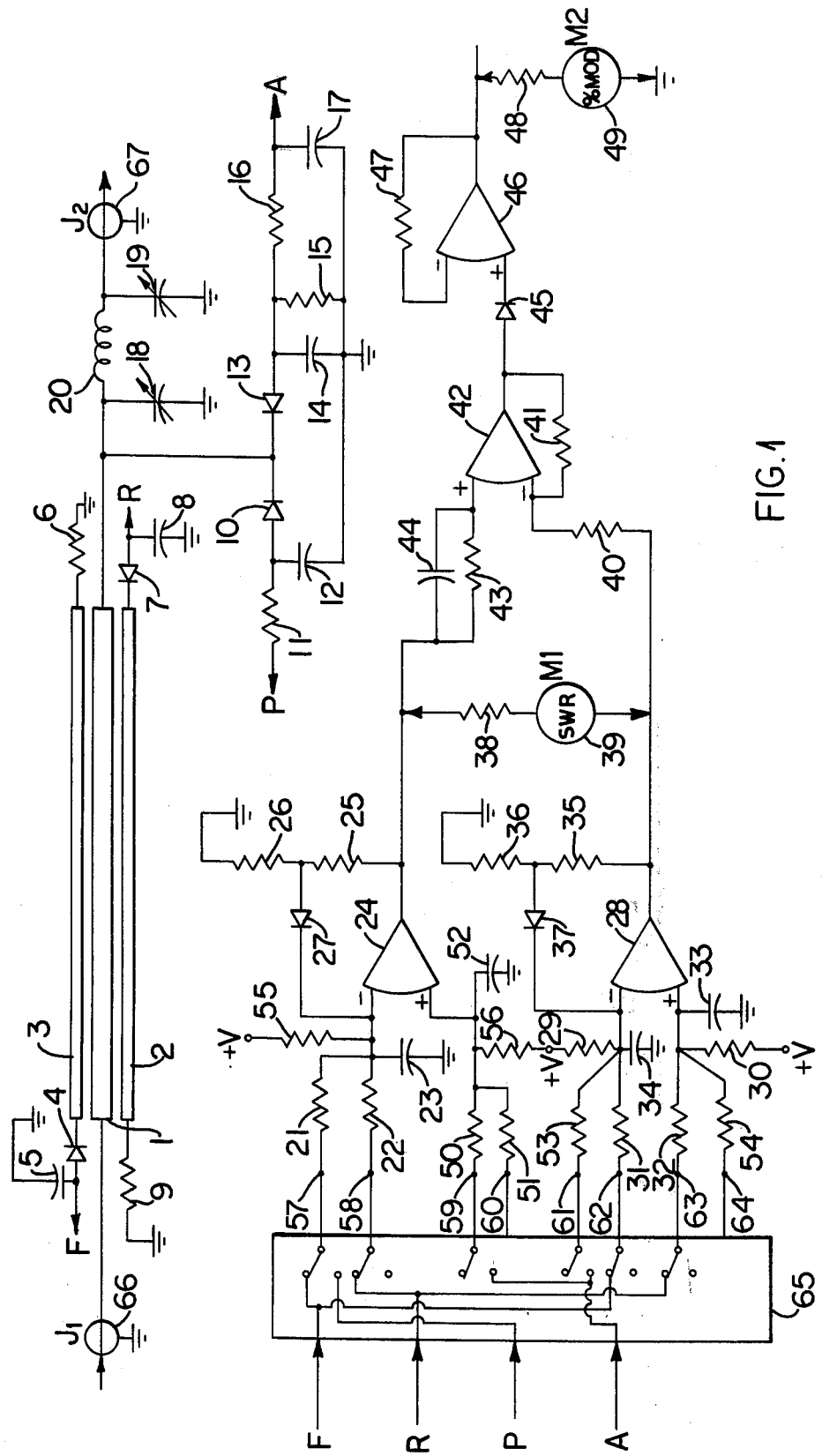
FIG. 1 is a circuit diagram of a system embodying the invention.

With reference now to FIG. 1, there is shown a circuit diagram of a system for detecting, indicating, and adjusting the degree of mismatch between a transmitter and an electrical transmission line, with additional measurement of transmitter performance parameters.

A main conductor 1 connects an input jack 61 to an adjustable impedance matching network consisting of adjustable capacitors 18, 19 and inductor 20. The impedance matching network output is connected to output jack 67. Conductors 2 and 3 are arranged parallel and close to conductor 1 in such a way that traveling waves on conductor 1 induce traveling waves on conductors 2 and 3. Conductor 3 is terminated at the end towards the load by a resistor 6, whose value is chosen such that the alternating voltage at the input end is proportional to the forward wave propagating on conductor 1. This alternating voltage is rectified by a peak detector consisting of diode 4 and capacitor 5. The DC voltage across capacitor 5 is thus proportional to the amplitude of the forward or incident wave existing on main conductor 1, and is denoted by F in FIG. 1. Similary, conductor 2 is terminated at its input end by a resistor 9 whose value is chosen such that the alternating voltage at the load end is proportional to the reflected wave propagating on conductor 1. This alternating voltage is rectified by a peak detector consisting of diode 7 and capacitor 8. The DC voltage across cpacitor 8 is thus proportional to the amplitude of the reverse or reflected wave existing on main conductor 1, and is denoted by R in FIG. 1.

The two DC voltages F and R are used as inputs to the standing wave ratio computer to be described later.

For the measurement of transmitter power output and modulation percentage, addition detection circuitry is provided as follows. Diode 10, capacitor 12, and resistor 11 constitute a peak holding detector whose time constant is selected sufficiently long so as to produce a DC voltage at the junction of diode 10 and capacitor 12 that is proportional to the peak of the envelope of the amplitude modulated wave shape appearing at the input to the impedance matching network. This voltage is denoted by p in FIG. 1. Another peak holding detector is constructed of diode 13, capacitor 14, and resistor 15. The time constant of this detector is proportioned to the frequencies present in the modulating signal in the same manner as a conventional linear diode detector, so that the signal at the junction of diode 13, capacitor 14 and resistor 15 consists of two components: a component proportional to the modulating signal, and a DC component proportional to the carrier amplitude. Resistor 16 and capacitor 17 comprise a low pass filter, whose DC output voltage A is then proportional to the carrier amplitude, even in the presence of amplitude modulation.

The two DC voltages A and P are used as inputs to the modulation percentage computer to be described later. Essentially the same computer circuitry is used for the calculation standing wave ratio and for the calculation of modulation percentage; however, the inputs are different for the two cases.

The computer consists of operational amplifiers 24, 28, 42, and 46, together with associated circuitry as will now be described; basically, amplifiers 24 and 28 are logarithmic amplifiers, amplifier 42 is a differencer and amplifier 46 is an antilogarithmic amplifier.

With respect to operational amplifier 24, resistors 21 and 22 constitute input resistors producing a current into the inverting input of operational amplifier 24 proportional to the sum of the voltages applied to resistors 21 and 22. Likewise, resistors 50 and 51 constitute input resistors, producing a current into the noninverting input of operational amplifier 24 proportional to the sum of the voltages applied to resistors 50 and 51. Resistors 25 and 26 constitute a resistive voltage divider between the output of amplifier 24 and ground; a fraction of the output voltage of amplifier 24 is applied to diode 27, generating a feedback current into the inverting input of amplifier 24 that is an exponential function of the voltage across diode 27, which voltage is essentially equal to the voltage divider output since the inverting input voltage is small. Thus, amplifier 24 functions as a logarithmic amplifier as a consequence of the nonlinear feedback network. Resistors 55 and 56 are bias resistors whose function is to control the operating point of the inputs of amplifier 24, and capacitors 23 and 52 serve as bypass capacitors. If the voltages at terminals 57, 58, 59, and 60 are denoted by $V_{57}$, $V_{58}$, $V_{59}$, and $V_{60}$, then the output voltage of amplifier 24 is proportional to the logarithm of the difference of $V_{57}$ plus $V_{58}$ and $V_{59}$ plus $V_{60}$; i.e., proportional to $\log [(V_{57}+V_{58}) - (V_{59}+V_{60})]$.

Amplifier 28 and associated circuitry are identical to amplifier 24: resistors 53 and 31 are input resistors to the inverting input of amplifier 28; resistors 32 and 54 are input resistors to the noninverting input of amplifier 28; resistors 35, 36, and diode 37 are a nonlinear feedback network similar to resistors 25, 26, and diode 27; resistors 29 and 30 are bias resistors; and capacitors 33 and 34 are bypass capacitors. Hence, if the voltages at terminals 61, 62, 63, and 64 are denoted by $V_{61}$, $V_{62}$, $V_{63}$, and $V_{64}$, the output voltage of amplifier 28 is proportional to $\log [(V_{61}+V_{62})-(V_{63}+V_{64})]$.

Function switch 65 connects signals F, R, P, and A to appropriate input terminals 57 through 64, depending on the quantity being measured. For example, if the instrument is in the standing wave ratio mode, F is connected to terminal 57, R is connected to terminal 58, F is connected to terminal 62, and R is connected to terminal 63. The output voltage of amplifier 24 is thus proportional to log [F + R], and the output voltage of amplifier 28 is proportional to log [F − R]. Meter 39 and calibration resistor 38 produce a meter deflection proportional to the difference in voltage between the outputs of amplifier 24 and amplifier 28; hence the meter deflection is proportional to $$\log [F + R] - \log [F - R] = \log [(F + R)/(F - R)] = \log [SWR]$$

or to the logarithm of the standing wave ratio, providing a desirable scale expansion near 1:1 stading wave ratio.

In addition, amplifier 42, together with input resistors 40, 43 and feedback resistor 41 produces an output voltage proportional to the difference of the outputs of amplifiers 24 and 28. Capacitor 44 serves to stabilize amplifier 42 from spurious oscillations encountered in certain modes of operation. Thus the output voltage of amplifier 42 is also proportional to the logarithm of the standing wave ratio.

Amplifier 46 is an exponential or antilogarithmic amplifier: diode 45 produces a current to the noninverting input of amplifier 46 that is proportional to the exponential of the output voltage of amplifier 42, and the feedback current through resistor 47 to the inverting input of amplifier 46 is approximately proportional to the output voltage of amplifier 46. Hence the output voltage of amplifier 46 is proportional to the exponential of its input voltage, or proportional to $$\exp [\log [SWR]] = swr$$

That is, the output voltage of amplifier 46 is proportional to the standing wave ratio. Meter 49 and calibration resistor 48 measure this output voltage, providing a meter deflection proportional to the standing wave ratio.

In summary, meter deflections proportional to the log of the standing wave ratio and also proportional to the standing wave ratio itself are obtainable from this circuit.

When the function switch 65 is in the modulation percentage position, the circuit functions in a similar fashion, except that P is connected to terminal 57, and A is connected to terminals 59 and 61. Thus, the output voltage of amplifier 24 is proportional to log [P − A] and the output voltage of amplifier 28 is proportional to log [A]. Thus, the voltage across the meter 39 is proportional to $$\log [P - A] - \log [A] = \log [(P - A)/A] = \log [\% MOD]$$

or proportional to the logarithm of the modulation percentage. Amplifiers 42 and 46 function as before to produce a deflection on meter 49 directly proportional to the modulation percentage.

Either meter may also be connected by the switch to read voltage P, in which case the meter deflection is proportional to a long time averaged peak envelope power, or to read voltage A, in which case the meter deflection is proportional to carrier power, or to read the output of diode 13, in which case the meter deflection is proportional to a short time averaged peak envelope power. Various of these readings are of interest, depending on whether the transmitter is using amplitude or single sideband modulation.

Function switch 65 also serves to connect and disconnect power from the instrument.

Although a particular preferred embodiment of the invention has been disclosed in detail for illustrative purposes, it will be recognized that variations or modifications of the disclosed apparatus, including the rearrangement of parts, lie within the scope of the present invention.

The embodiments of the invention in which an exclusive property or privilege is claimed are defined as follow:

1. A measurement system for output signals from radio transmitters and the like, comprising:
   sensor means responsive to said output signals for producing first and second measurement signals which together define an operating characteristic of said transmitter or the like;
   first and second operational amplifier means each having plural sum and difference computing input means to which said first and second measurement signals are applied, said first and second operational amplifier means also having means rendering logarithmic the outputs thereof;
   means coupled across the output paths of said first and second operational amplifier means for responding to the difference between said outputs thereof and thus for providing a signal which is a logarithmic function of the ratio of two quantities, one of which quantities is related to the difference between said first and second measurement signals and the other of which quantities is related to at least one of said first and second measurement signals; and
   means responsive to said log function signal for providing a system output which is a measure of said operating characteristic of said transmitter or the like.

2. The system of claim 1, in which said first and second operational amplifier means comprise first and second operational amplifiers and said plural sum and difference computing input means comprises for each such operational amplifier an inverting input and a noninverting input for determining the difference between signals applied thereto and, connected to each such operational amplifier input, a summing junction, each such summing junction having on the input side thereof plural parallel impedances, and switch means actuable from position to position depending on the particular characteristic to be measured, said sensor means including further means for producing third and fourth measurement signals defining a second operating characteristic of said transmitter or the like, said measurement signals being applied to the input side of said switching means and the latter being actuable for applying a pair of said measuring signals to said switching means.

3. The system of claim 1, in which said first and second operational amplifier means comprises first and second operational amplifiers, respectively, said means rendering logarithmic the output thereof comprising, for each said operational amplifier, a feedback network including a resistive voltage divider between the output of said amplifier and ground and a diode connected to such voltage divider to sample a fraction of the output voltage of the amplifier and apply a corresponding feedback current to the inverting input of such amplifier as an exponential function of the voltage across such diode, such that such amplifier functions as a logarithmic amplifier.

4. The apparatus of claim 1, in which said sensor means includes a network to be coupled to said transmitter or the like, said network including a first peak holding detector having a relatively long time constant for producing an output voltage P proportional to the absolute peak of the transmitter output under modulation conditions, said network further including a second peak holding detector having a relatively very short time constant for providing an output of voltage A whose DC component is proportional to the average transmitter output and thus to the unmodulated carrier, said second network having at its output a low pass filter to eliminate any unwanted non-DC component of said output voltage A, means connecting the output of said first detector and the output of said low pass filter to said first and second operational amplifier means in a manner to provide across the outputs of said first and second operational amplifier means a voltage proportional to $$\log [P - A] - \log [A] = \log [(P - A)/A] = \log [\% MOD]$$

where % MOD is the modulation percentage.

5. The system of claim 1, in which said means responsive to said logarithmic signal includes a third operational amplifier means having a pair of inputs respectively coupled to the outputs of said first and second operational amplifier means for calculating the difference between such two amplifier outputs, and a fourth operational amplifier means arranged as an antilog circuit and means coupled to the output of said fourth operational amplifier means for yielding said measure of said operating characteristic as the antilog of said logarithmic function signal.

6. The apparatus of claim 5, in which said sensor means includes a network to be coupled to said transmitter or the like, said network including a first peak holding detector having a relatively long time constant for producing an output voltage P proportional to the absolute peak of the transmitter output under modulation conditions, said network further including a second peak holding detector having a relatively very short time constant for providing an output of voltage A whose DC component is proportional to the average transmitter output and thus to the unmodulated carrier, said second network having at its output a low pass filter to eliminate any unwanted non-DC component of said output voltage A, means connecting the output of said first detector and the output of said low pass filter to said first and second operational amplifier means in a manner to provide across the outputs of said first and second operational amplifier means a voltage proportional to $$\log [P - A] - \log [A] = \log [(P - A)/A] = \log [\% MOD]$$

where % MOD is the modulation percentage, such that the output of said fourth operational amplifier means is proportional to % MOD.

7. The system of claim 1, in which said sensor means comprises an electrically short selection of three wire transmission line feeding an adjustable LC impedance matching network and where in the wires are resistively terminated at opposite ends such that one has a voltage proportional to the forward wave and the other a voltage proportional to the reverse wave generated at its unterminated end, in response to coupling of the output signals from said transmitter or the like to said transmission line, said forward and rearward wave proportional voltages being said first and second measurement signals.

8. The system of claim 7, including means for applying said forward wave voltage and reverse wave voltage to said sum and difference computing input means to provide a voltage difference across the outputs of said first and second operational amplifier means proportional to $$\log [F + R] - \log [F - R] = \log [(F + R)/(F - R)] = \log [SWR]$$

where F and R respectively represent the forward and reverse wave voltages and SWR is the standing wave ratio.

9. The system of claim 8, including a SWR meter in series with a resistor across said operational amplifier means outputs for displaying SWR as measured.

* * * * *